(12) United States Patent
Nagai

(10) Patent No.: US 11,562,883 B2
(45) Date of Patent: Jan. 24, 2023

(54) ELECTRON MICROSCOPE AND BEAM IRRADIATION METHOD

(71) Applicant: KIOXIA CORPORATION, Tokyo (JP)

(72) Inventor: Takamitsu Nagai, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 308 days.

(21) Appl. No.: 16/796,425

(22) Filed: Feb. 20, 2020

(65) Prior Publication Data

US 2020/0411278 A1 Dec. 31, 2020

(30) Foreign Application Priority Data

Jun. 26, 2019 (JP) .............................. JP2019-118864

(51) Int. Cl.
*H01J 37/22* (2006.01)
*H01J 37/20* (2006.01)
*H01J 37/244* (2006.01)
*H01J 37/28* (2006.01)

(52) U.S. Cl.
CPC .............. *H01J 37/22* (2013.01); *H01J 37/20* (2013.01); *H01J 37/244* (2013.01); *H01J 37/28* (2013.01); *H01J 2237/2448* (2013.01); *H01J 2237/281* (2013.01); *H01J 2237/2806* (2013.01)

(58) Field of Classification Search
CPC .......... H01J 37/22; H01J 37/20; H01J 37/244; H01J 37/28; H01J 2237/2448; H01J 2237/2806; H01J 2237/281; H01J 37/026; H01J 37/265; H01J 2237/0041; H01J 2237/0048
See application file for complete search history.

(56) References Cited

U.S. PATENT DOCUMENTS

| | | | | |
|---|---|---|---|---|
| 5,412,209 A | * | 5/1995 | Otaka | H01J 37/28 250/396 ML |
| 5,594,245 A | * | 1/1997 | Todokoro | H01J 37/3005 250/307 |
| 5,866,904 A | * | 2/1999 | Todokoro | G01B 15/00 250/307 |
| 6,066,849 A | | 5/2000 | Masnaghetti et al. | |

(Continued)

FOREIGN PATENT DOCUMENTS

| | | |
|---|---|---|
| JP | H05-151927 A | 6/1993 |
| JP | 2006-127903 A | 5/2006 |
| JP | 2007-128738 A | 5/2007 |

*Primary Examiner* — David A Vanore
(74) *Attorney, Agent, or Firm* — Foley & Lardner LLP

(57) ABSTRACT

An electron microscope includes a stage on which a sample is capable of being placed, a beam generator, a detector, a display, and a controller. The beam generator emits a charged particle beam with which the sample is irradiated. The detector detects a secondary electron or an electron generated from the sample by irradiation with the charged particle beam. The display displays an image of the sample based on a signal from the detector. The controller executes a first irradiation process of specifying a position of a hole bottom by scanning the sample with the charged particle beam when capturing an image of the hole bottom of a hole provided in the sample, and executes a second irradiation process of imaging a shape of the hole bottom by irradiating the hole bottom with the charged particle beam via the hole.

1 Claim, 10 Drawing Sheets

(56) References Cited

U.S. PATENT DOCUMENTS

| | | | |
|---|---|---|---|
| 7,977,632 B2 * | 7/2011 | Todokoro | H01J 37/026 |
| | | | 250/311 |
| 8,519,334 B2 | 8/2013 | Tadaka et al. | |
| 9,202,665 B2 * | 12/2015 | Matsui | H01J 37/28 |
| 9,472,376 B2 * | 10/2016 | Yokosuka | G01B 15/00 |

* cited by examiner

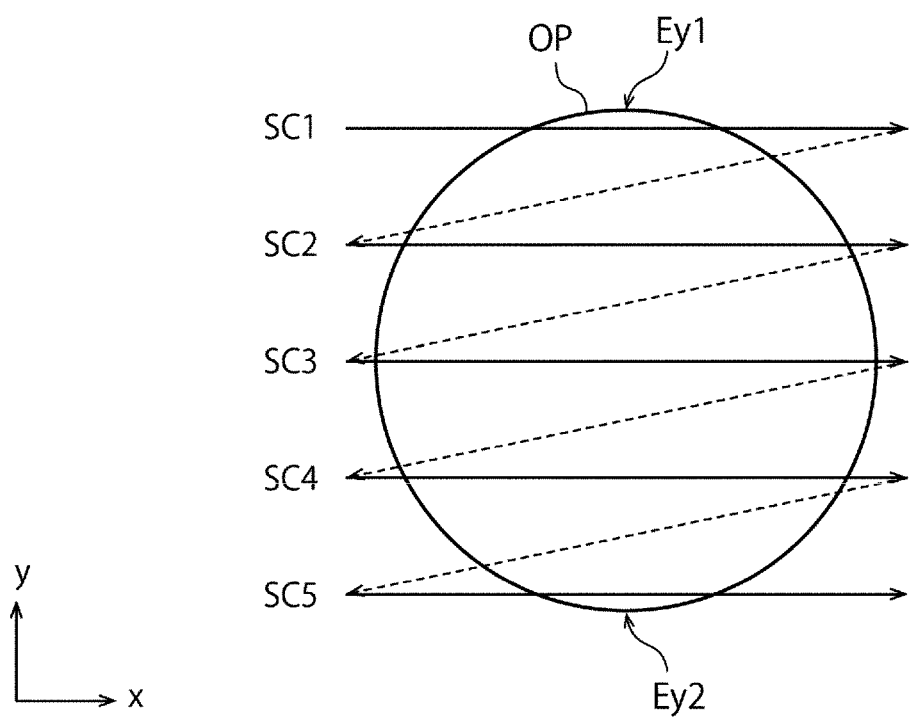

ELECTRON MICROSCOPE AND BEAM IRRADIATION METHOD

CROSS-REFERENCE TO RELATED APPLICATION

This application claims the benefit of and priority to Japanese Patent Application No. 2019-118864, filed Jun. 26, 2019, the entire contents of which are incorporated herein by reference.

FIELD

Embodiments described herein relate generally to an electron microscope and a beam irradiation method.

BACKGROUND

A scanning electron microscope is used to observe a sample by irradiating the sample with an electron beam and detecting a secondary electron or reflected electron generated from the sample. In order to observe a bottom surface of a contact hole or memory hole with such a microscope, it is necessary to detect the secondary electron or reflected electron generated from the bottom surface of the contact hole or memory hole.

However, in a three-dimensional memory cell array in which memory cells are three-dimensionally arranged, an aspect ratio of the memory hole becomes very high as the degree of integration increases. When the aspect ratio of the memory hole becomes higher, the secondary electron or reflected electron from the bottom surface is difficult to reach an upper end opening of the memory hole. When the periphery or side wall of the memory hole is irradiated with an electron beam (primary electron), the front surface or side wall of the sample is charged, and thus the secondary electron or reflected electron receives an asymmetrical force from a charge at the upper end opening or the side wall of the memory hole and is difficult to exit from the memory hole.

DESCRIPTION OF THE DRAWINGS

FIG. 6 is a conceptual diagram illustrating how the upper end opening is raster scanned with an electron beam.

DETAILED DESCRIPTION

Figure 1:
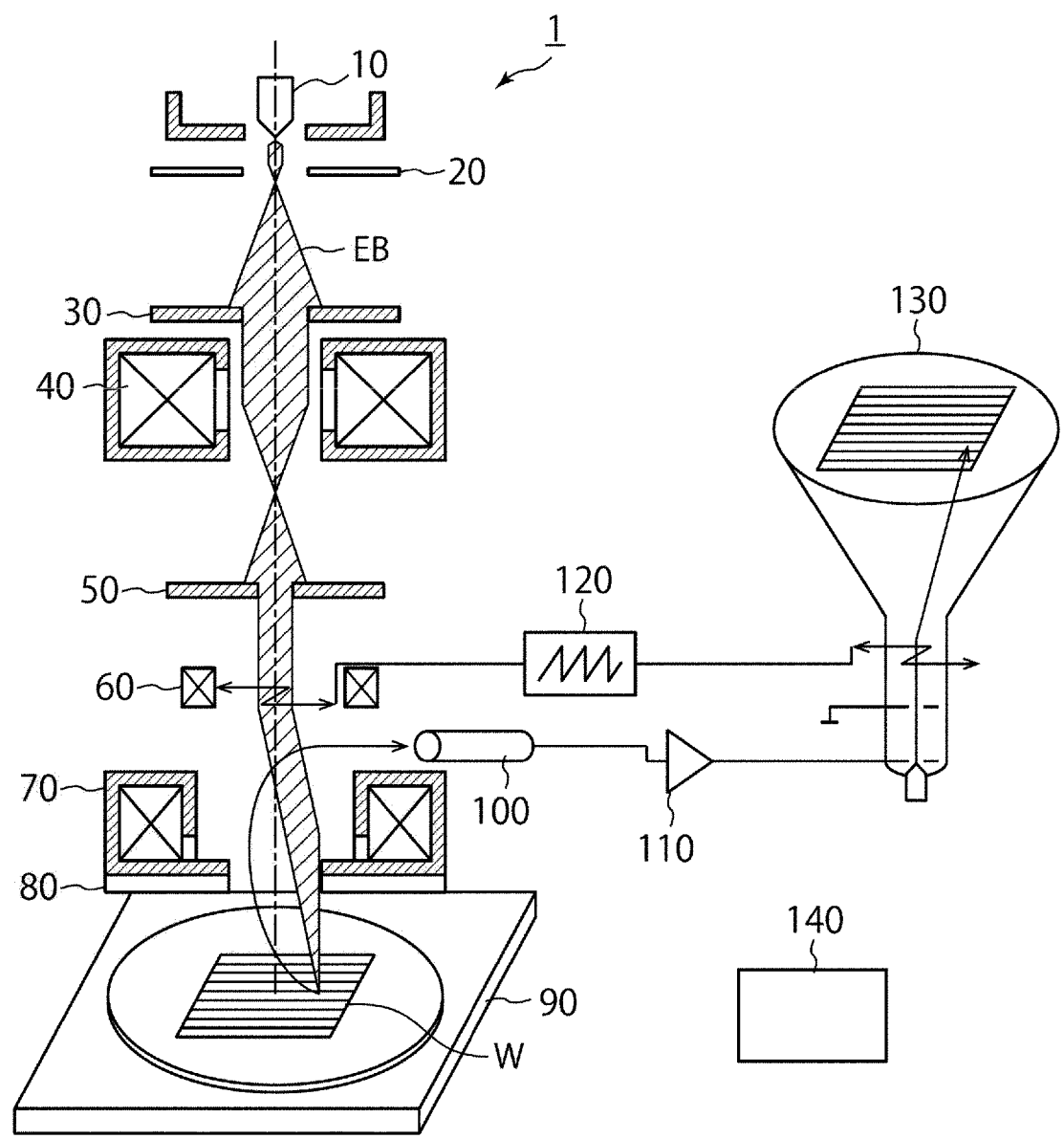
FIG. 1 is a diagram illustrating a configuration example of a scanning electron microscope according to a first embodiment.

Embodiments provide an electron microscope and a beam irradiation method capable of easily observing the bottom of a pattern having a high aspect ratio.

An electron microscope according to an embodiment may include a stage on which a sample is capable of being placed. A beam generation unit (beam generator) may emit a charged particle beam with which the sample is irradiated. A detection unit (detector) may detect a secondary electron or reflected electron generated from the sample by irradiation with the charged particle beam. A display unit (display) may display an image of the sample based on a signal from the detection unit. A control unit (controller) may execute a first irradiation process of specifying a position of a hole bottom by scanning the sample with the charged particle beam when capturing an image of the hole bottom of a hole provided in the sample, and execute a second irradiation process of imaging a shape of the hole bottom by irradiating the hole bottom with the charged particle beam via the hole.

Hereinafter, embodiments of the present disclosure will be described with reference to the accompanying drawings. The embodiments do not limit the present disclosure. The drawings are schematic or conceptual, and the proportions of respective portions are not necessarily the same as the actual values thereof. In the specification and the drawings, the same components as those described with regard to the previous drawings will be denoted by the same reference numerals and signs, and detailed description thereof will be omitted as appropriate.

First Embodiment

FIG. 1 is a diagram illustrating a configuration example of a scanning electron microscope according to a first embodiment. A scanning electron microscope (hereinafter also simply referred to as a microscope) 1 includes an electron gun 10 as a beam generation unit, a cathode 20, an aperture 30, a condenser lens 40, an aperture 50, a scanning coil 60, an objective lens 70, and a control electrode 80, a stage 90, a detector 100, an amplifier 110, a scan generator 120 as a control unit, a monitor 130 as a display unit, and a controller 140 as a control unit. The microscope 1 according to this embodiment may be a device that images a front surface shape and the like of a sample W by irradiating the sample W with an electron beam as a charged particle beam and detecting a secondary electron or reflected electron (hereinafter collectively referred to as an electron) generated by the irradiation. The charged particle beam may be an electron beam as well as an ion beam.

The sample W is, for example, a semiconductor wafer or a semiconductor chip including a semiconductor element (not illustrated). The semiconductor element may be, for example, a three-dimensional memory cell array in which memory cells are three-dimensionally arranged. The three-dimensional memory cell array may have many memory holes having a high aspect ratio. In order to image a hole bottom of a memory hole having such a high aspect ratio, the hole bottom may be irradiated with an electron beam and an electron generated from the hole bottom of the memory hole may be collected and detected. The microscope 1 according to this embodiment may have the following configuration in order to efficiently collect the electron from the memory hole.

The electron gun 10 emits an electron beam. The electron beam may be emitted from the cathode 20 by applying a voltage. The aperture 30 may also function to shape the electron beam and limit the current. The condenser lens 40 may converge the electron beam. With this configuration, the electron beam can be shaped into a predetermined shape and have a predetermined beam diameter. The aperture 50 may remove noise from the electron beam.

The scanning coil 60 may deflect the electron beam under the control of the scan generator 120 and irradiate any position on the sample W with the electron beam. That is, the scanning coil 60 can control the position irradiated with the electron beam. The objective lens 70 may further focus the electron beam to a desired beam diameter and irradiate the sample W placed on the stage 90 with the electron beam.

The stage 90 may be configured so that the sample W can be placed thereon. The stage 90 may be movable in the horizontal direction or the vertical direction with the sample W placed thereon. Any position on the surface of the sample W can be irradiated with the electron beam by controlling the electron beam by the scanning coil 60 and the operation of the stage 90.

When the sample W is irradiated with the electron beam, an electron may be generated from the sample W. Depending on conditions, a positive or negative voltage may be applied to the control electrode 80, and the electron may be pulled up from the sample W by the control electrode 80 and reach the detector 100 via the objective lens 70. The detector 100 may detect the electron from the sample W. The detector 100 may output a detection signal in accordance with the detected amount of electrons. The amplifier 110 may amplify the detection signal from the detector 100 and display the detection signal on the monitor 130. The monitor 130 may display an image of the sample W based on the signal from the detector 100.

The scan generator 120 may determine a scanning sequence of the electron beam and control the scanning coil 60. The scan generator 120 may send a detection signal synchronized with the scanning coil 60 to the monitor 130. The monitor 130 may display the detection signal in synchronization with the scanning of the electron beam. With this configuration, the monitor 130 can accurately display the front surface shape of the sample W. The controller 140 may control each component of the microscope 1. The controller 140 may include a memory therein and store programs, parameters, and the like for controlling each component of the microscope 1. The control unit may include the scan generator 120 and the controller 140.

Figure 3A:
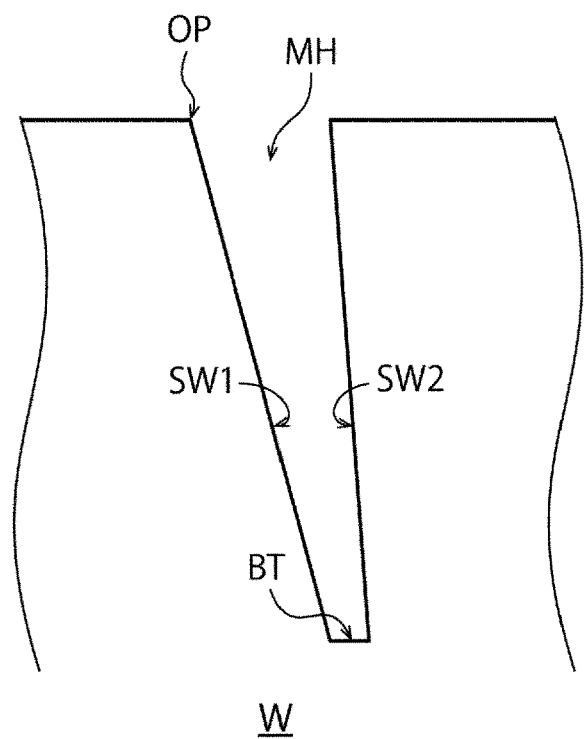
FIG. 3A is a schematic cross-sectional view illustrating an example of a shape of a memory hole.

In this embodiment, an image of a hole bottom BT of a memory hole MH as illustrated in FIG. 3A is taken by using the microscope 1 having the configuration described above. Hereinafter, an imaging method of the hole bottom BT will be described.

Figure 2A:
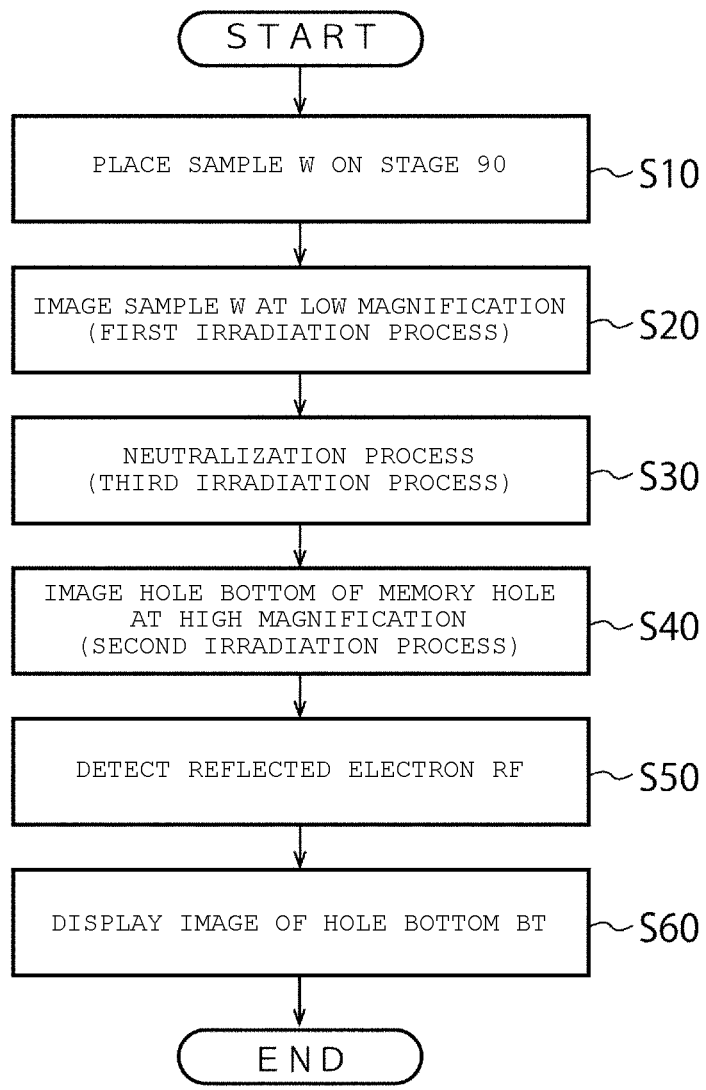
FIG. 2A is a flowchart illustrating an example of a memory hole imaging method according to the first embodiment.

FIG. 2A is a flowchart illustrating an example of an imaging method of the memory hole MH according to the first embodiment. An imaging target may be an unevenness pattern having a high aspect ratio, and may be a hole pattern, a slit pattern, or the like, for example.

First, the sample W may be placed on the stage 90 (S10).

Next, for example, the microscope 1 may scan the electron beam at a low magnification that allows the hole pattern as an imaging target to be a fraction of an area of a screen on a monitor screen and the position of the hole pattern can be specified, and images an alignment pattern of the sample W and the memory hole MH (first irradiation process) (S20). In this case, in the memory in the controller 140, the coordinates of a certain alignment pattern may be stored as a reference, and the relative coordinates of the memory hole MH with respect to the alignment pattern may be stored. The stage 90 may move the sample W based on the coordinates of the reference alignment pattern and the relative coordinates of the memory hole MH. With this configuration, the stage 90 can recognize an outline of the hole pattern by moving the imaging position of the sample W to the memory hole MH as an electron beam irradiation position.

Here, in the first irradiation process, the microscope 1 may scan the electron beam at a magnification lower than the magnification at the time of inspection, and image the alignment pattern and the memory hole MH. In this first irradiation process, the microscope 1 may irradiate a wider area than the memory hole MH with the electron beam and image at a low magnification. Therefore, a current density per unit area of the sample W may become low, and the charge amount of electrons may become larger than the charge amount of electron beams. In this case, the surface of the sample W around the memory hole MH may be easily positively charged.

Figure 2B:
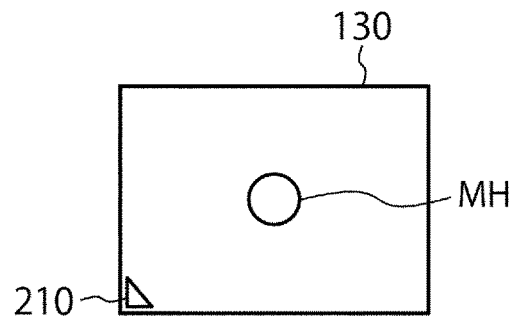
FIG. 2B is an image view of a memory hole imaged at low magnification in a first irradiation process.
Figure 2C:
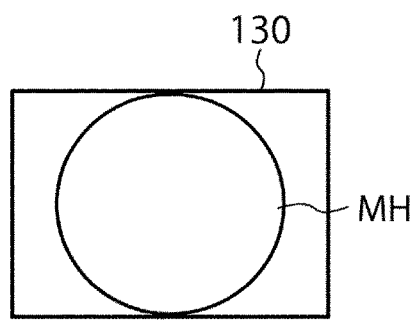
FIG. 2C is an image view of a memory hole imaged at high magnification in a second irradiation process.

FIG. 2B is an image view of the memory hole MH imaged at a low magnification in the first irradiation process. FIG. 2C is an image view of the memory hole MH imaged at a high magnification in a second irradiation process. "210" of FIG. 2B indicates an alignment pattern. On the screen of the monitor 130, in the first irradiation process, the image may be captured at a low magnification, and thus both the alignment pattern 210 and the memory hole MH may be imaged, and their positional relationship (relative coordinates) can be found. Since the coordinates of the alignment pattern 210 are known in advance, the absolute coordinates of the memory hole MH can be found based on the relative coordinates of the memory hole MH. Based on the absolute coordinates of the memory hole MH, a hole pattern with high magnification illustrated in FIG. 2C may be imaged.

Figure 3B:
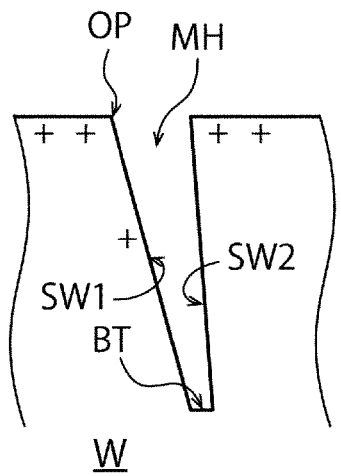
FIG. 3B is a view illustrating a charged state of the memory hole.
Figure 3C:
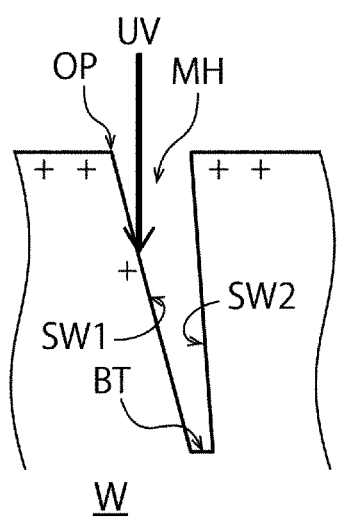
FIG. 3C is a diagram illustrating neutralization processing of charging of the memory hole.
Figure 4:
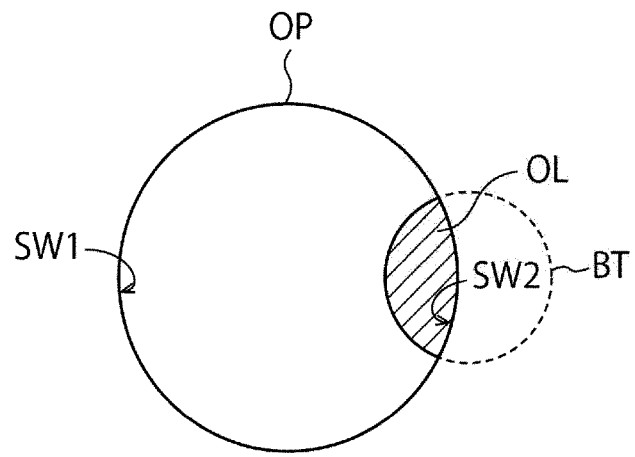
FIG. 4 is a schematic plan view illustrating a positional relationship between an upper end opening and a hole bottom of the memory hole.

As illustrated in FIGS. 3A to 3C, the side walls of the memory hole MH may have a taper. In this case, when seen from above the surface of the sample W, as illustrated in FIG. 4, the center of an upper end opening OP of the memory hole MH and the center of the hole bottom BT of the memory hole MH may shift and become asymmetric and become asymmetric. In this case, as illustrated in FIG. 3A, a sidewall SW1 of a part of the memory hole MH is inclined from the hole bottom BT toward the outside of the memory hole MH, and a sidewall SW2 of the other part of the memory hole MH is inclined from the hole bottom BT toward the inside of the memory hole MH. The side wall SW1 can be seen from the upper end opening OP when seen from above the sample W, but the side wall SW2 cannot be seen from the upper end opening OP when seen from above the sample W. In this case, in the first irradiation process described above, as illustrated in FIG. 3B, the surface of the side wall SW1 that can be seen from the upper end opening OP in the memory hole MH is often more easily charged than the side wall that is difficult to see on the opposite side.

Accordingly, the sample W may be irradiated with an electron beam so as to electrically neutralize the sample W positively charged in the first irradiation process (third irradiation process) (S30). In a neutralization process as the third irradiation process, the scan generator 120 may irradiate the periphery of the memory hole MH with an electron beam to electrically neutralize the sample W charged in the first irradiation process. When the charge amount of the electron beams is larger than the charge amount of the electrons, the front surface of the sample W around the memory hole MH may be negatively charged. In this case, ultraviolet (UV) rays may be applied instead of the electron beam. For example, as illustrated in FIG. 3C, electrons can be removed from the front surface of the sample W by irradiation with ultraviolet rays (see FIG. 11). An example of irradiating ultraviolet rays is described as the third irradiation process for electrically neutralizing the sample W, but is not limited thereto. As long as the sample W charged in the first irradiation process can be electrically neutralized, other charge removal methods such as ion beam irradiation may be used.

Next, the electron beam may be scanned at a magnification higher than that in the first irradiation process, and capture an image of the hole bottom BT of the memory hole MH (second irradiation process) (S40). The position of the hole bottom BT of the memory hole MH can be found from the image obtained by the first irradiation process. The scan generator 120 may control the electron beam so that the hole bottom BT of the memory hole MH is irradiated with the electron beam through the memory hole MH. With this configuration, the hole bottom BT may be irradiated with the electron beam and the shape of the hole bottom BT may be imaged.

The detector 100 may detect the electron RF emerged from the memory hole MH (S50). Then, the monitor 130 may display the detection signal in synchronization with the scanning coil 60, and display an image of the hole bottom BT (S60).

In this case, when the sample W is being charged, the electrons generated from the hole bottom BT in FIG. 3A may be bent depending on a charged state of the sample W and collide with the side wall of the memory hole MH, and may not come out of the memory hole MH. For example, when the surface of the sample W is irradiated with the electron beam in a rectangular shape with respect to the circular memory hole MH, the charged state around the memory hole MH becomes asymmetric, and an electron trajectory is easily bent. In this case, in the second irradiation process, the electron from the hole bottom BT cannot be collected from the memory hole MH or the trajectory is bent and the number of electrons entering the detector is reduced.

In contrast, according to this embodiment, charging of the sample W may be electrically neutralized by the neutralization process. Accordingly, it is easy to adjust the conditions so that the electron generated from the hole bottom BT is emitted from the memory hole MH without being bent in the memory hole MH and reaches the detector. With this configuration, in the second irradiation process, the detector 100 can easily detect the electron from the hole bottom BT.

Here, as illustrated in FIG. 3A, the side walls SW1 and SW2 of the memory hole MH may have a taper. FIG. 3A is a schematic cross-sectional view illustrating a shape example of the memory hole MH. In this case, as illustrated in FIG. 4, the upper end opening OP and the hole bottom BT of the memory hole MH are shifted and become asymmetric when seen from above the surface of the sample W. FIG. 4 is a schematic plan view illustrating a positional relationship between the upper end opening OP and the hole bottom BT of the memory hole MH. When the upper end opening OP is seen from above the surface of the sample W, a portion OL of the hole bottom BT can be seen, but the other part of the hole bottom BT cannot be seen. In this case, in the second irradiation process, the scan generator 120 irradiates a portion OL (hereinafter referred to as an overlapped portion OL) of the hole bottom BT that overlaps the upper end opening OP with the electron beam. With this configuration, the hole bottom BT is mainly irradiated with the electron beam. Accordingly, the electron beam is not directly applied to the surface of the sample W or the side wall of the memory hole MH, and charging of the surface of the sample W or the side wall of the memory hole MH is prevented.

Figure 5:
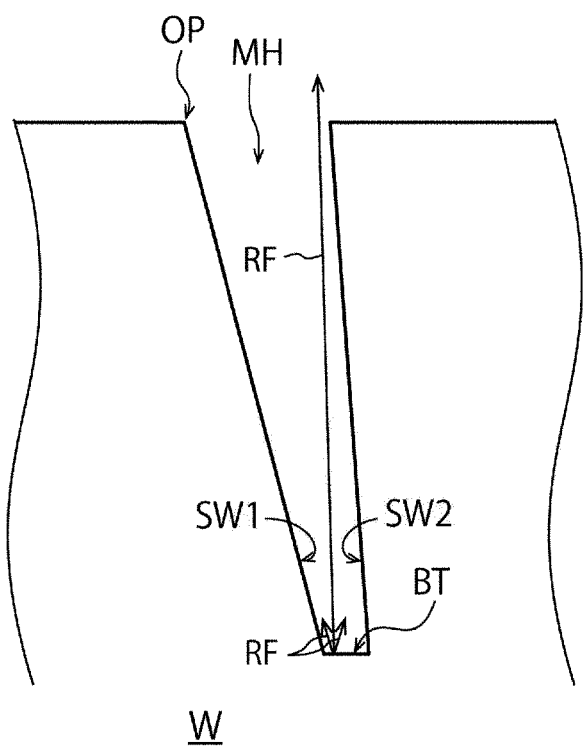
FIG. 5 is a schematic cross-sectional view illustrating a traveling direction of a reflected electron.

On the other hand, as illustrated in FIG. 5, electrons not only travel upward from the hole bottom BT toward the upper end opening OP, but also travel from the hole bottom BT toward the side wall of the memory hole MH in an inclined direction. FIG. 5 is a schematic cross-sectional view illustrating the traveling direction of the electron RF. The side walls of the memory hole MH, particularly the side walls near the hole bottom BT, may be charged by the electron RF. Such charging of the side walls of the memory hole MH also causes the electron RF to bend. For example, as illustrated in FIG. 5, the memory hole MH has side walls SW1 and SW2. The side wall SW1 is inclined from the hole bottom BT toward the outside of the memory hole MH, and is inclined so as to be seen from the upper end opening OP when seen from above the sample W. The side wall SW2 is inclined from the hole bottom BT toward the inside of the memory hole MH, and cannot be seen from the upper end opening OP when seen from above the sample W. In this case, more electrons RF may fly to the side wall SW2 than to the side wall SW1. Accordingly, the side wall SW2 may be more easily charged positively or negatively than the side wall SW1. With this configuration, the electron RF generated thereafter is easily bent and is not easily emitted from the memory hole MH. Accordingly, if the scan generator 120 continuously irradiates the same or close position with the electron beam, the side walls SW1 and SW2 located near the irradiation position may be charged, and the electron RF is difficult to exit from the memory hole MH. Alternatively, the overlapped portion OL irradiated with the electron beam is closer to the side wall SW1 and is relatively far from the side wall SW2. Accordingly, more electrons RF may fly to the side wall SW1 than to the side wall SW2. In this case, the side wall SW1 may be more easily charged positively or negatively than the side wall SW2. In this case as well, it is difficult for the electronic RF to exit from the memory hole MH.

FIG. 6 is a conceptual diagram illustrating how the upper end opening OP is raster scanned with an electron beam. In the raster scan, the scan generator 120 repeatedly executes substantially linear scanning SC1 to SC5 of the electron beam in the x-direction from one end Ey1 to the other end Ey2 in the y-direction of the upper end opening OP. With this configuration, the entire upper end opening OP is scanned two-dimensionally (in a plane) with the electron beam. In FIG. 6, although five scanning SC1 to SC5 are illustrated, more scanning SCn (n is a positive integer) may be executed in order to scan the entire upper end opening OP in a plane with an electron beam.

However, in the raster scan, since scanning SC1 to SC5 are sequentially executed from one end Ey1 to the other end Ey2 of the upper end opening OP, scanning SC2 is executed next to scanning SC1 and at a position adjacent to scanning SC1. In this case, the electric charge charged in scanning SC1 remains on the side walls of the memory hole MH, and the electron RF due to scanning SC2 is difficult to be emitted from the memory hole MH. Similarly, scanning SC3 is performed next to scanning SC2 and at a position adjacent to scanning SC2. Accordingly, the charge charged in scanning SC2 remains on the side wall of the memory hole MH, and the electron RF due to scanning SC3 is difficult to be emitted from the memory hole MH. The scan SC4 is executed next to scanning SC3 and at a position adjacent to scanning SC3. Accordingly, the charge charged in scanning SC3 remains on the side wall of the memory hole MH, and the electron RF due to scanning SC4 is difficult to be emitted from the memory hole MH. The scan SC5 is executed next to scanning SC4 and at a position adjacent to scanning SC4. Accordingly, the charge charged in scanning SC4 remains on the side wall of the memory hole MH, and the electron RF due to scanning SC5 is difficult to be emitted from the memory hole MH. As such, when the raster scan is used, it becomes difficult to detect the electronic RF, and it becomes difficult for the monitor 130 to accurately display the shape of the hole bottom BT.

When the sidewalls SW1 and SW2 are charged, the charge usually disappears over time. For example, when the sample W has a stacked structure of a silicon oxide film and a silicon nitride film, the charge generally disappears in a time in accordance with a scanning cycle. However, when raster scan is used, it is difficult to detect the electron RF because the electron beam is irradiated in the vicinity before the charges on the sidewalls SW1 and SW2 disappear. On the other hand, when the next scan is executed after waiting for the charge to disappear, the inspection time becomes very long.

Figure 7A:
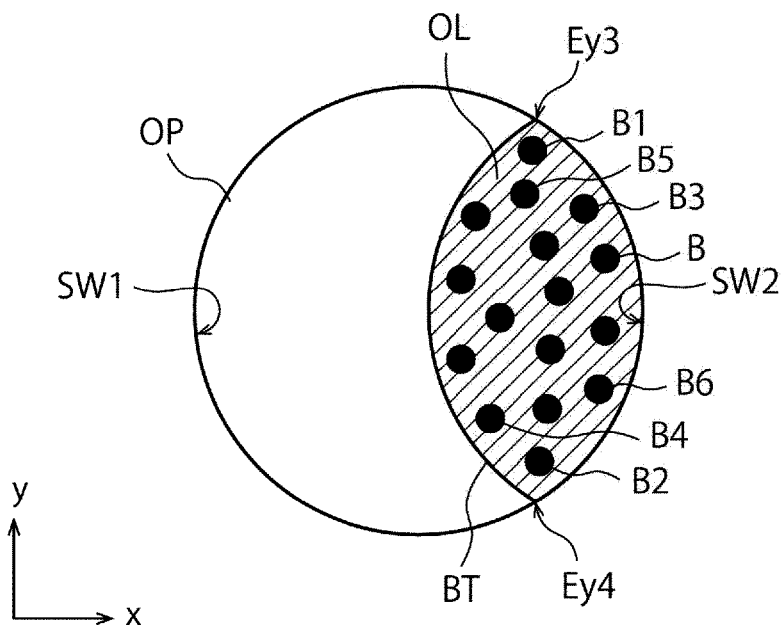
FIG. 7A is a conceptual diagram illustrating a second irradiation process according to the first embodiment.

Therefore, in this embodiment, in the second irradiation process, the scan generator 120 may randomly irradiate the hole bottom BT with an electron beam. FIG. 7A is a conceptual diagram illustrating the second irradiation process (random scan) according to the first embodiment. The scan generator 120 may emit an electron beam B randomly in a pulse shape without continuously scanning the electron beam B. The scan generator 120 may lay out the beam so as not to be missed with a minimum beam diameter using any random function within the range of the overlapped portion OL obtained in the first irradiation process. Any position coordinates can be selected by assigning a consecutive number to each position coordinate of the beam and generating that number with a random number, a place having the selected position coordinates is irradiated with the electron beam B. As a random function, for example, a mid-square method may be used. The random function is not limited to the mid-square method, and may be another algorithm that generates a random number. The scan generator 120 may control the scanning coil 60 so that the entire hole bottom BT is irradiated with the electron beam B.

By randomly emitting the electron beam B in a pulse shape, a distance between the previous irradiation position of the electron beam B and the next irradiation position can be separated from each other within the range of the overlapped portion OL. For example, in FIG. 7A, one end Ey3 of the overlapped portion OL may be irradiated with an electron beam B1, and then the other end Ey4 may be irradiated with an electron beam B2. Next, the right side of the one end Ey3 may be irradiated with an electron beam B3, and then the left side of the other end Ey4 may be irradiated with an electron beam B4. Furthermore, the left side of the one end Ey3 may be irradiated with an electron beam B5, and then the right side of the other end Ey4 may be irradiated with an electron beam B6.

In this case, the irradiation position of the electron beam B1 and the irradiation position of the electron beam B2 may be considerably separated from each other within the range of the overlapped portion OL. Accordingly, the electron RF generated by the electron beam B2 is not significantly affected by the charges accumulated on the side walls SW1 and SW2 by the electron beam B1, and is easily emitted from the memory hole MH. During the irradiation with the electron beam B2, most of the charges accumulated on the side walls SW1 and SW2 by the electron beam B1 may disappear. Accordingly, when the electron beam B3 is emitted after the irradiation with the electron beam B2, the charging of the side walls SW1 and SW2 by the electron beam B1 can be considerably reduced.

The irradiation position of the electron beam B2 and the irradiation position of the electron beam B3 may be also considerably separated in the overlapped portion OL. Therefore, the electron RF generated by the electron beam B3 is not significantly affected by the charges accumulated on the side walls SW1 and SW2 by the electron beam B2, and is easily emitted from the memory hole MH. During the irradiation with the electron beam B3, most of the charges accumulated on the sidewall SW1 or SW2 by the electron beam B2 may disappear. Accordingly, when the electron beam B4 is emitted after the irradiation with the electron beam B3, the charging of the side walls SW1 and SW2 by the electron beam B2 may be considerably reduced.

Similarly, since the irradiation position of the electron beam B3 and the irradiation position of the electron beam B4 are also considerably separated in the overlapped portion OL, the electron RF generated by the electron beam B4 is also easily emitted from the memory hole MH. When the electron beam B5 is emitted after the irradiation with the electron beam B4, the charging of the side walls SW1 and SW2 by the electron beam B3 can be considerably reduced.

Similarly, since the irradiation position of the electron beam B4 and the irradiation position of the electron beam B5 are also considerably separated in the overlapped portion OL, the electron RF generated by the electron beam B5 is also easily emitted from the memory hole MH. When the electron beam B6 is emitted after the irradiation with the electron beam B5, the charging of the side walls SW1 and SW2 by the electron beam B4 can be considerably reduced.

The same can be said for the electron beams B5 and B6. Accordingly, the electron RF generated by the electron beams B1 to B6 is not easily affected by the charging of the side walls SW1 and SW2, and is easily emitted from the memory hole MH. As a result, the monitor 130 can accurately display the image of the hole bottom BT.

Figure 7B:
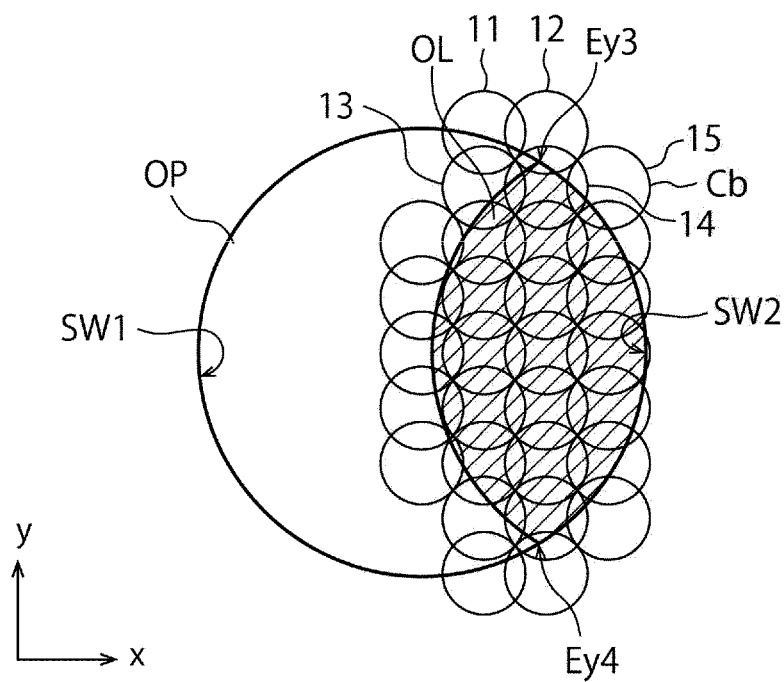
FIG. 7B is a conceptual diagram illustrating another second irradiation process according to the first embodiment.

FIG. 7B is a conceptual diagram illustrating another second irradiation process (random scan) according to the first embodiment. A circle Cb illustrated in FIG. 7B indicates an irradiation range of one pulse of the electron beam. Prior to the irradiation of the electron beam, the scan generator 120 may lay the circle Cb in advance on the overlapped portion OL so that the entire range of the overlapped portion OL is irradiated with the electron beam, and assign a serial number to the circle Cb. For example, the scan generator 120 assigns numbers 11, 12, 13, . . . in order from the circle Cb close to one end Ey3. In FIG. 7B, illustration of circles Cb numbered 16 and subsequent numbers is omitted. The scan generator 120 may generate the numbers 11, 12, 13, . . . with a random function, and irradiates the circle Cb corresponding to the numbers with an electron beam. With this configuration, the scan generator 120 can irradiate the circle Cb with the electron beam in a random order. In this way, the entire overlapped portion OL may be irradiated with the electron beam. In order to irradiate the entire range of the overlapped portion OL with the electron beam, the overlap between the adjacent beams may be determined in consideration of variations in irradiation positions of the beams.

As described above, the microscope 1 according to this embodiment may specify the position of the hole bottom BT of the memory hole MH in the first irradiation process and image the shape of the hole bottom BT (overlapped portion OL) by irradiating the hole bottom BT (overlapped portion OL) with the electron beam in the second irradiation process. In this case, the scan generator 120 randomly irradiates the hole bottom BT (overlapped portion OL) with the pulsed electron beam B. With this configuration, the distance between the irradiation positions of the adjacent electron beams B is increased, and the electron RF is not easily affected by the charging of the sidewalls SW1 and SW2. As a result, the S/N ratio of the image of the hole bottom BT (overlapped portion OL) can be improved and can be accurately observed.

According to this embodiment, the neutralization process may be performed between the first irradiation process and the second irradiation process. With this configuration, the surface of the sample W charged by the first irradiation process can be electrically neutralized. As a result, the electron RF from the hole bottom. BT is easily emitted from the memory hole MH.

In this embodiment, the scan generator 120 may randomly irradiate the hole bottom BT with the electron beam B, but may determine the next irradiation position based on the previous irradiation position of the electron beam B within the overlapped portion OL. For example, when the irradiation position of the electron beam B1 is close to one end Ey3 of the hole bottom BT (overlapped portion OL), the irradiation position of the next electron beam B2 may be set near the other end Ey4. When the irradiation position of the electron beam B3 is close to the side wall SW1 side of the hole bottom BT, the irradiation position of the next electron beam B4 may be set close to the side wall SW2 side of the hole bottom BT. In this way, by randomly emitting the electron beam B and separating the next irradiation position based on the previous irradiation position of the electron beam B, the influence of charging of the side walls SW1 and SW2 on the electrons can be reduced. As a result, the electron RF from the hole bottom BT can be easily emitted from the memory hole MH.

Second Embodiment

Figure 8:
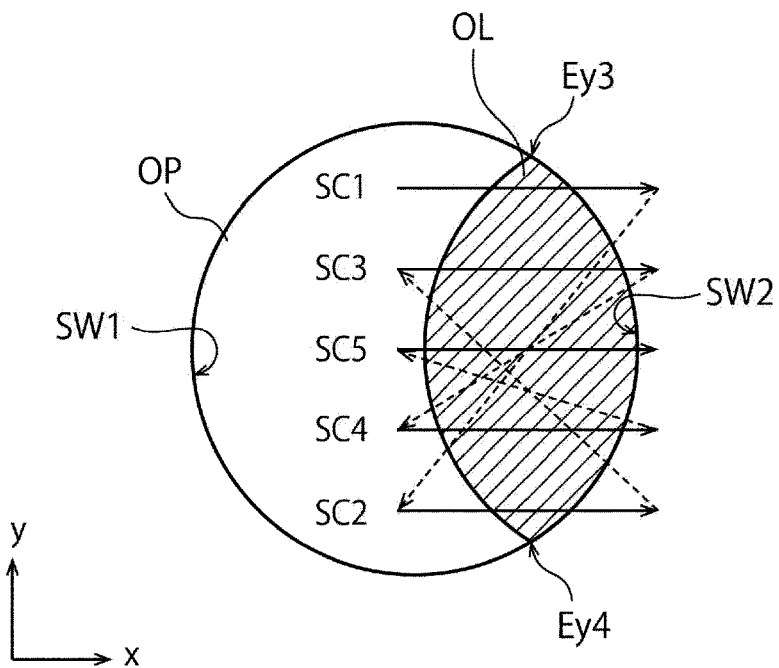
FIG. 8 is a conceptual diagram illustrating a second irradiation process according to a second embodiment.

FIG. 8 is a conceptual diagram illustrating a second irradiation process according to the second embodiment. In the second embodiment, the scan generator 120 may scan the electron beam B substantially linearly in the x-direction, but scan the electron beam B alternately from both end portions Ey3 and Ey4 in a direction (y-direction) substantially perpendicular to the scanning direction (x-direction) toward the center portion. For example, the scan generator 120 may execute scanning SC1 near the one end Ey3 of the hole bottom BT (overlapped portion OL), and then execute scanning SC2 near the other end Ey4. Next, the scan generator 120 may execute scanning SC3 closer to the center than one end Ey3 of the hole bottom BT (overlapped portion OL) and the SC1, and then execute scanning SC4 closer to the center than the other end Ey4 and the SC2. Then, the scan generator 120 may perform scanning SC5 near the center of the hole bottom BT. In FIG. 8, five scanning SC1 to SC5 are illustrated, but more scanning SCn (n is a positive integer) may be performed in order to scan the entire overlapped portion OL in a plane with the electron beam. The scanning distance (scanning time) in the x-direction of scanning SCn is almost the same. The microscope 1 may repeat such scanning SC1 to SCn and irradiate the entire overlapped portion OL of the hole bottom BT with the electron beam B to obtain an image of the overlapped portion OL. With this configuration, asymmetry of the charging in the y-direction can be relaxed.

When charging is asymmetric in the x-direction and the adjacent positions are continuously scanned, as the time interval between the adjacent first and second scans, it is preferable to select the shortest time in order to shorten the scanning time in a predetermined time equal to or greater than the relaxation time (about 1 to 5 scanning times) during which charging is relaxed. With this configuration, charging itself can be relaxed and the asymmetry of the charging in the x-direction also can be relaxed. For example, scanning SC4 and SC5 as the first and second scans are adjacent to each other and continuously scanned. In this case, an interval from the start of scanning SC4 to the start of scanning SC5 may be a predetermined time equal to or greater than the relaxation time. When the interval from the start of scan SC4 to the start of scan SC5 is less than the relaxation time, the scan generator 120 may provide a waiting time before the start of scan SC5. With this configuration, at the start of scanning SC5, charging generated by scanning SC4 can be relaxed. As a result, the electron RF from the hole bottom BT is easily emitted from the memory hole MH.

As such, the scan generator 120 may gradually bring the scanning of the electron beam B closer to the center portion of the hole bottom BT while alternately repeating the scanning on the one end Ey3 side and the scanning on the other end Ey4 side of the hole bottom BT. With this configuration, the distance between scanning SC1 and scanning SC2 can be increased, the distance between scanning SC2 and scanning SC3 can be increased, and the distance in the y-direction between scanning SC3 and scanning SC4 can be increased. Furthermore, as described above, time intervals of a plurality of scanning start that is close to (adjacent to) each other can be spaced apart by a relaxation time or more. As a result, the second embodiment can reduce the influence of the charging of the sidewalls SW1 and SW2 on the electrons as in the first embodiment.

Although not illustrated, the scanning distance (scanning time) in the x-direction may be changed according to the shape of the overlapped portion OL. That is, the scanning distance of each scan may be the same as or slightly larger than the width of the overlapped portion OL in the x-direction, and the electron beam may be scanned over the entire width of the overlapped portion OL. For example, the scanning distance (travelling time) may be shortened near both end portions Ey3 and Ey4, and the scanning processing (travelling time) may be lengthened in the central portion of the overlapped portion OL. Even in this way, the scan generator 120 can irradiate the entire overlapped portion OL with the electron beam. In this case, when the positions adjacent to each other are continuously scanned, the time interval between the adjacent scans is preferably equal to or greater than the relaxation time in order to reduce the asymmetry of the charging in the x-direction. Here, it is assumed that the scanning time is Tsc, the movement time from the end of certain scanning to the start of the next scanning is Ttr, and the relaxation time is Td. In this case, the waiting time Tst for stopping or turning off the electron beam between one scanning and the next scanning is Td-Tsc-Ttr. For example, the time interval from the start of scanning SC4 to the start of scanning SC5 is preferably set to the relaxation time Td or more. In this case, if the scanning time of scanning SC4 is Tsc and the movement time from the end of scanning SC4 to the start of the next scan SC5 is Ttr, the waiting time Tst from the end of scanning SC4 to the start of scanning SC5 may be Td-Tsc-Ttr or more. That is, after the end of scanning SC4, the scan generator 120 may wait for Td-Tsc-Ttr or more and then move to the start point of scanning SC5 to start scanning. With this configuration, the asymmetry of charging in the x-direction can be relaxed. The relaxation time of a material with high insulation may be adjusted to 5 times or more of the scanning time.

Third Embodiment

Figure 9:
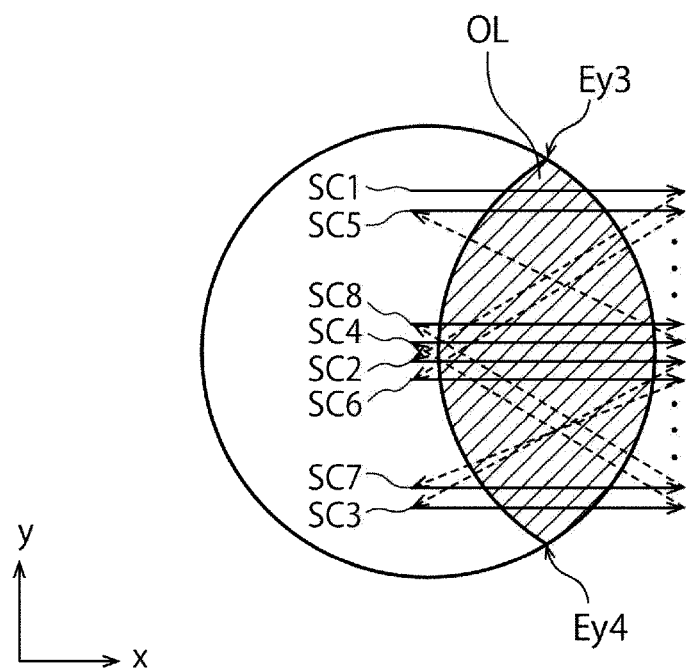
FIG. 9 is a conceptual diagram illustrating a second irradiation process according to a third embodiment.

FIG. 9 is a conceptual diagram illustrating a second irradiation process according to the third embodiment. In the third embodiment, the scan generator 120 may alternately perform scanning in the x-direction at both end portions Ey3 and Ey4 and the central portion. For example, the scan generator 120 may execute scanning SC1 on a portion located near one end Ey3 of the hole bottom BT, and then execute scanning SC2 on the other end Ey4 side near the center. Next, the scan generator 120 may execute scanning SC3 on a portion located near the other end Ey4, and then execute scanning SC4 on the one end Ey3 side near the center. Next, the scan generator 120 may execute scanning SC5 on the center side near the one end Ey3, and then execute scanning SC6 on the other end Ey4 side near the center. Next, the scan generator 120 may execute scanning SC7 on the center side near the other end Ey4, and then execute scanning SC8 on the one end Ey3 side near the center. The microscope 1 may repeat such scanning SC1, SC2, SC3 . . . , and irradiates the entire overlapped portion OL of the hole bottom BT with the electron beam B to obtain an image of the overlapped portion OL. Although eight scanning SC1 to SC8 are illustrated in FIG. 8, more scanning SCn may be executed in order to scan the entire overlapped portion OL in a plane with the electron beam. As in the second embodiment, a relaxation time may be provided also in the x-direction according to the side wall distance.

In this way, the scan generator 120 can shift the scan position in the y-direction while alternately repeating the scan on the one end Ey3 side, the scan on the center portion, and the scan on the other end Ey4 side of the hole bottom BT. With this configuration, time intervals between a plurality of scanning that is close to each other (adjacent) can be spaced to some extent. As a result, similarly to the first embodiment, in the third embodiment, the influence of charging of the sidewalls SW1 and SW2 on the electrons can also be reduced.

Fourth Embodiment

Figure 10A:
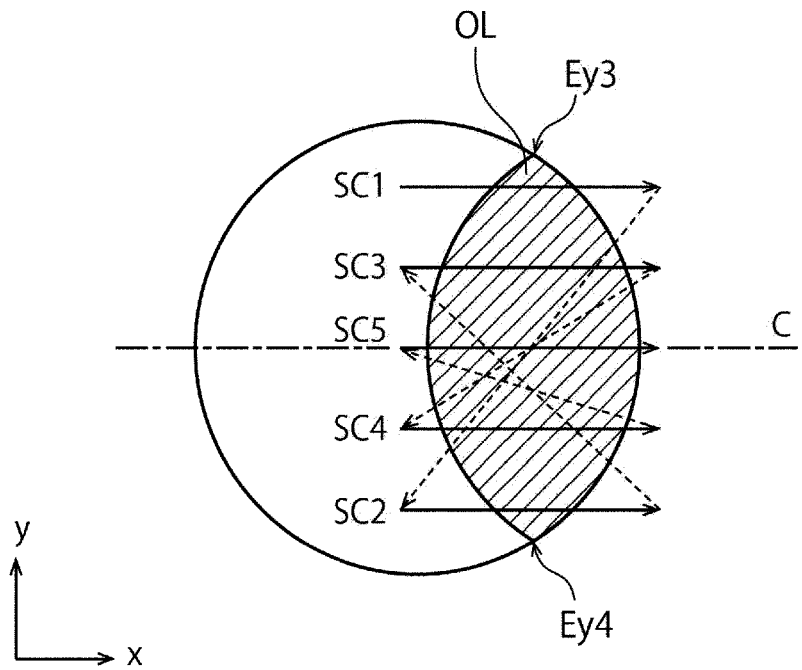
FIG. 10A and FIG. 10B is a conceptual diagram illustrating a second irradiation process according to a fourth embodiment.
Figure 10B:
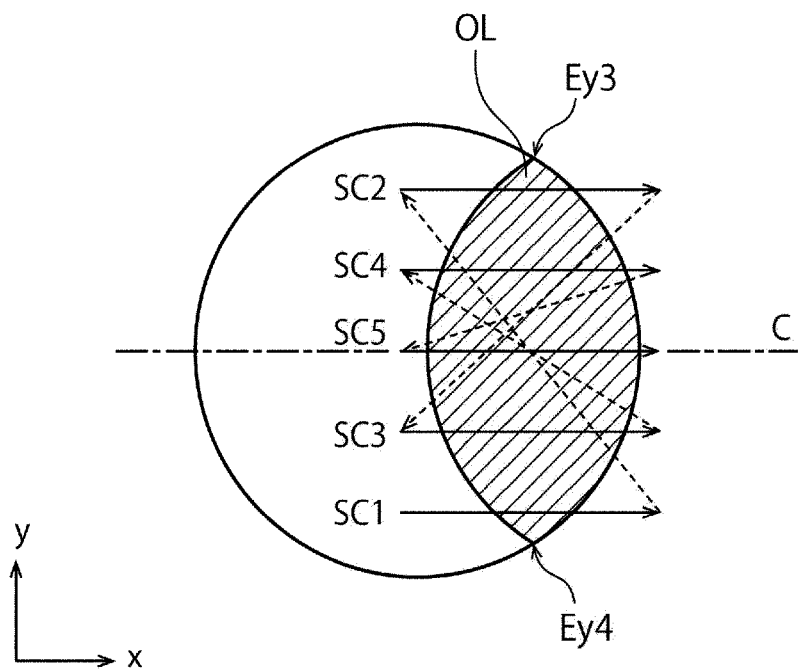

FIGS. 10A and 10B are conceptual diagrams illustrating a second irradiation process according to a fourth embodiment. In the fourth embodiment, after the scan illustrated in FIG. 10A is executed, the scan illustrated in FIG. 10B is executed. The scan execution order may be reversed, that is, the scan illustrated in FIG. 10A may be executed after the scan illustrated in FIG. 10B is executed.

FIG. 10A is the same as FIG. 8, and the scan generator 120 may perform a scan in the same manner as in the second embodiment. The scan illustrated in FIG. 10B is in an inverted state (symmetric) with respect to the central axis C between one end Ey3 and the other end Ey4, with respect to the scan in FIG. 10A. That is, in FIG. 10A, scanning may be started from one end Ey3 of the overlapped portion OL, but in FIG. 10B, scanning may be started from the other end Ey4 on the opposite side of the overlapped portion OL. With this configuration, the charged state in the sample W is also symmetric with respect to the central axis C.

The scan illustrated in FIG. 10 (A) may be similar to that of the second embodiment. Accordingly, the description of the scan illustrated in FIG. 10A is omitted. On the other hand, in the scan illustrated in FIG. 10B, for example, first, scanning SC1 may be executed on a portion located near the other end Ey4 of the hole bottom BT, and then scanning SC2 may be executed on a portion located near the one end Ey3. Next, the scan generator 120 may execute scanning SC3 closer to the center than the other end Ey4 side of the hole bottom BT and SC1, and then execute scanning SC4 closer to the center than the one end Ey3 side and SC2. Then, the scan generator 120 may execute scanning SC5 near the center of the hole bottom BT. In FIG. 10B, five scanning SC1 to SC5 are illustrated, but more scanning SCn may be executed in order to scan the entire upper end opening OP in a plane with an electron beam. However, the number of scanning SC1 to SCn in FIG. 10B is preferably the same as the number of scanning SC1 to SCn in FIG. 10A in order to make the charged state in the sample W symmetrical with respect to the central axis C.

If a detection signal obtained from the scan started from one end Ey3 is a first detection signal and a detection signal obtained from the scan started from the other end Ey4 is a second detection signal, the first detection signal and the second detection signal may be detection signals that are substantially symmetrical with respect to the central axis C. That is, the charged states of the upper half and the lower half of the central axis C of the first detection signal may correspond to the charged states of the lower half and the upper half of the central axis C of the second detection signal, respectively. Accordingly, the detector 100 may add or detect the first detection signal and the second detection signal and output the result to the monitor 130. With this configuration, a difference between charging of the lower half and charging of the upper half of the central axis C is canceled, and the first and second detection signals are signals that are symmetric with respect to the central axis C. As a result, the influence of the charges charged on the side walls SW1 and SW2 can be canceled to a certain extent, and the monitor 130 can display a more accurate image.

Modification Example

Figure 11:
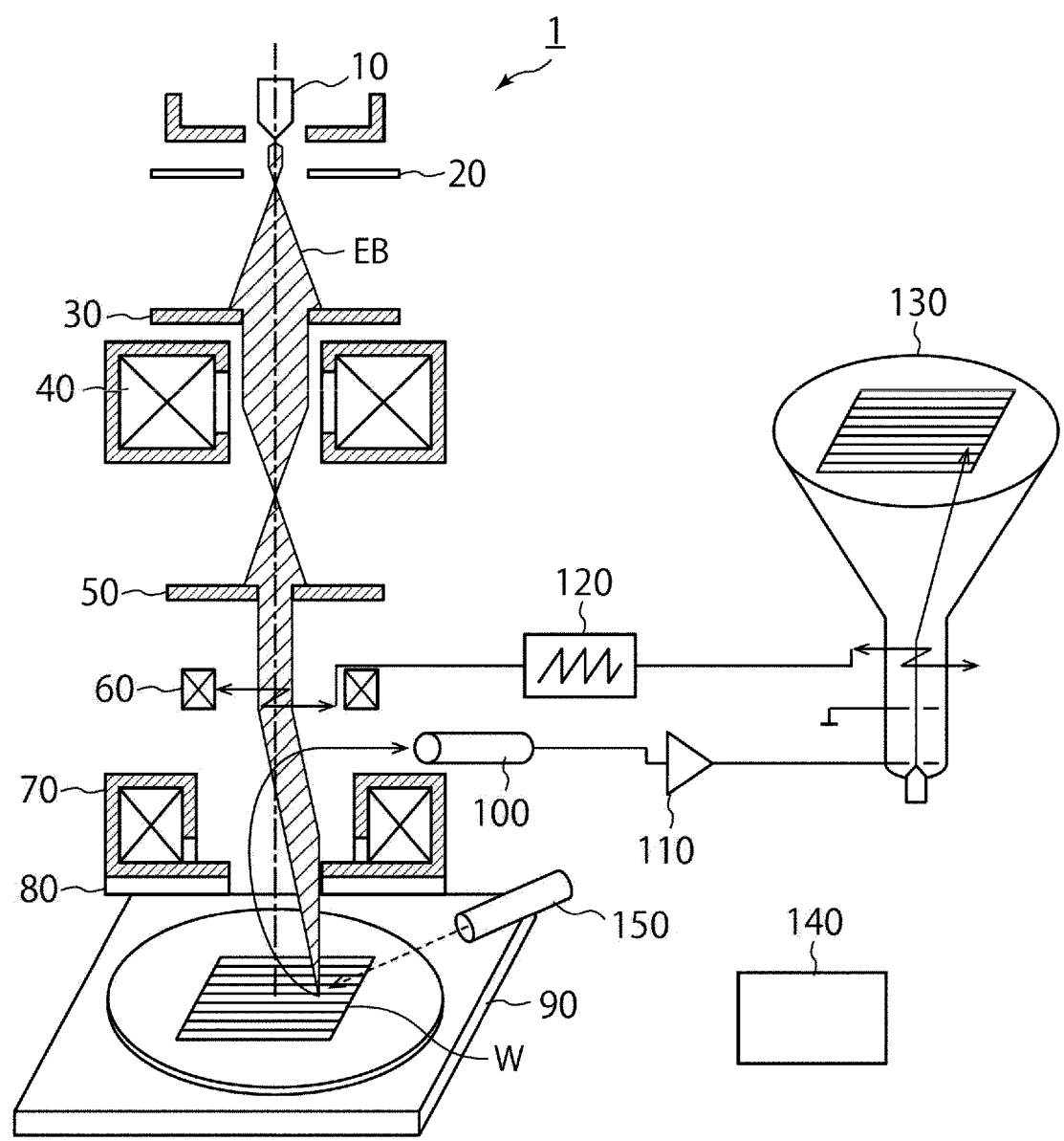
FIG. 11 is a diagram illustrating a configuration example of a microscope according to a modified example.

FIG. 11 is a diagram illustrating a configuration example of a microscope according to a modification example. The microscope 1 further includes an ultraviolet beam gun 150 that emits ultraviolet rays. The wavelength of ultraviolet rays may be 120 nm or more. Other configurations of the microscope 1 of this modification example may be the same as the corresponding configurations of the first embodiment.

The ultraviolet beam gun 150 may irradiate the front surface of the negatively charged sample W with an ultraviolet beam. With this configuration, charging of the sample W can be relaxed. This modification example can also obtain the effects of the first embodiment. This modification example may also be applied to any of the second to fourth embodiments.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method for capturing an image of a bottom of a hole formed in a sample, the method comprising:
   scanning a first charged particle beam on a surface of the sample on which the hole is formed at a first magnification, the first charged particle beam having a first electric type;
   determining a position and a shape of the bottom of the hole of the sample based on a result of scanning of the first charged beam;
   irradiating a side wall of the hole with an ultraviolet ray or a second charged particle beam having a second electric type opposite to the first electric type thereby electrically neutralizing the side wall of the hole;
   scanning a third charged particle beam on the bottom of the sample at a second magnification, the second magnification being higher than the first magnification; and
displaying the shape of the bottom of the sample based on a result of scanning of the third charged particle beam.

* * * * *